United States Patent
Harnik et al.

(10) Patent No.: US 10,341,467 B2
(45) Date of Patent: Jul. 2, 2019

(54) NETWORK UTILIZATION IMPROVEMENT BY DATA REDUCTION BASED MIGRATION PRIORITIZATION

(71) Applicant: INTERNATIONAL BUSINESS MACHINES CORPORATION, Armonk, NY (US)

(72) Inventors: Danny Harnik, Tel Mond (IL); Alexei Karve, Mohegan Lake, NY (US); Andrzej Kochut, Mount Kisco, NY (US); Dmitry Sotnikov, Rishon-Lezion (IL)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 656 days.

(21) Appl. No.: 14/994,423

(22) Filed: Jan. 13, 2016

(65) Prior Publication Data

US 2017/0201602 A1   Jul. 13, 2017

(51) Int. Cl.
   *G06F 16/30* (2019.01)
   *H04L 29/06* (2006.01)
   *H04L 29/08* (2006.01)

(52) U.S. Cl.
   CPC ............. *H04L 69/04* (2013.01); *H04L 67/06* (2013.01)

(58) Field of Classification Search
   CPC ........... G06F 11/1453; G06F 17/30082; G06F 17/3015; G06F 17/30486; G06F 17/30504; G06F 17/30159; H04L 69/04; H04L 67/06; H04L 67/1097
   See application file for complete search history.

(56) References Cited

U.S. PATENT DOCUMENTS

| 7,870,105 B2 * | 1/2011 | Arakawa ............... G06F 3/0605 707/692 |
| 8,686,881 B1 | 4/2014 | Harnik et al. |
| 2014/0195498 A1 | 7/2014 | Asher et al. |
| 2017/0220422 A1 * | 8/2017 | Butt .................... G06F 11/1453 |

OTHER PUBLICATIONS

Calton Pu, Fine-Grain Adaptive Compression in Dynamically Variable Networks, in Distributed Computing Systems, 2005. ICDCS 2005. Proceedings. 25th IEEE International Conference, pp. 685-694, Jun. 10-10, 2005.

Bogdan Nicolae, Towards Scalable On-Demand Virtual Disk I/O in IaaS Clouds: An Adaptive Collaborative Content Exchange Proposal, Journal of Parallel and Distributed Computing archive, vol. 87 Issue C, Jan. 2016 pp. 67-79.

(Continued)

*Primary Examiner* — Cheryl Lewis
(74) *Attorney, Agent, or Firm* — Tutunjian & Bitetto, P.C.; Samuel Waldbaum

(57) ABSTRACT

Methods and systems for data transfer include adding a data chunks to a priority queue in an order based on utilization priority. A reducibility score for the data chunks is determined. A data reduction operation is performed on a data chunk having a highest reducibility in the priority queue using a processor if sufficient resources are available. The data chunk having the lowest reducibility score is moved from the priority queue to a transfer queue for transmission if the transfer queue is not full.

19 Claims, 5 Drawing Sheets

(56) References Cited

OTHER PUBLICATIONS

Eyal Zohar, Automatic and Dynamic Configuration of Data Compression for Web Servers, LISA'14 Proceedings of the 28th USENIX conference on Large Installation System Administration, Nov. 2014, pp. 97-108.
Alexei Karve, Image Transfer Optimization for Agile Development, in Integrated Network Management (IM 2013), 2013 IFIP/IEEE International Symposium, pp. 554-560, May 27-31, 2013.
Andrzej Kochut, Leveraging Local Image Redundancy for Efficient Virtual Machine Provisioning, in Network Operations and Management Symposium (NOMS), 2012 IEEE, pp. 179-187, Apr. 16-20, 2012.
Zhiming Shen, VMAR: Optimizing I/O Performance and Resource Utilization in the Cloud, Middleware 2013, ACM/IFIP/USENIX 14th International Middleware Conference, Beijing, China, Dec. 9-13, 2013, Proceedings, pp. 183-203.
Alexei Karve, Redundancy Aware Virtual Disk Mobility for Cloud Computing, in Cloud Computing (CLOUD), 2013 IEEE Sixth International Conference, pp. 35-42, Jun. 28-Jul. 3, 2013.
Danny Harnik, To Zip or not to Zip: Effective Resource Usage for Real-Time Compression, Proceedings of the 11th USENIX conference on File and Storage Technologies Fast '13, Dec. 2, 2013, pp. 229-242.

\* cited by examiner

US 10,341,467 B2

NETWORK UTILIZATION IMPROVEMENT BY DATA REDUCTION BASED MIGRATION PRIORITIZATION

BACKGROUND

Technical Field

The present invention relates to data reduction and, more particularly, to reduction of data at the storage and network level by prioritizing data according to compressibility and duplication.

Description of the Related Art

Data reduction is used at both the storage level and at the network level to reduce the amount of data that is stored or moved over a connection. Various data reduction techniques are available according to the scenario and goal at hand. In most storage cases, particularly in archival systems, the goal is to obtain the highest compression ratio and, thus, reduce the amount of storage needed. In network transmissions, the goal is to complete data transfers as fast as possible.

When time is a factor, such as in network transmissions, compression time may play a role alongside compression ratio in determining how best to compress the data, due to the fact that a time-consuming compression process will add a substantial burden on the latency of transmissions. Compression engines have been introduced with the intent of obtaining meaningful compression and maximum speeds, attempting to find the optimal tradeoff between the two. Other approaches to data reduction include de-duplication, which quickly identifies if data already exists at the target location and, if so, foregoes the actual transfer, instead identifying the portions of data at the destination that may be used to reconstruct the data being transmitted.

However, existing data reduction approaches often fail to take into account the actual content of the data itself. In addition, existing approaches fail to re-organize data handling when large amounts of data are to be transferred. In a naïve approach, one cuts the data into chunks and compresses each chunk with multiple engines to find the best fit to transmit. However, this is resource intensive, slow, and includes data that is incompressible. As a result, the existing approaches to data reduction for network transmissions are sub-optimal.

SUMMARY

A method for data transfer includes adding a plurality of data chunks to a priority queue in an order based on utilization priority. A reducibility score for the plurality of data chunks is determined. A data reduction operation is performed on a data chunk having a highest reducibility in the priority queue using a processor if sufficient resources are available. The data chunk having the lowest reducibility score is moved from the priority queue to a transfer queue for transmission if the transfer queue is not full.

A method for data transfer includes adding a plurality of data chunks to a priority queue in an order based on utilization priority determined from historical utilizations statistics. A reducibility score for the plurality of data chunks is determined by determining a de-duplication potential of each data chunk and determining a compressibility of each data chunk. A data reduction operation is performed on a data chunk having a highest reducibility in the priority queue using a processor, if sufficient resources are available, by performing one or more of de-duplication and compression on the data chunk. A new reducibility score is assigned to the reduced data chunk. The data chunk having the lowest reducibility score is moved from the priority queue to a transfer queue for transmission if the transfer queue is not full.

A system for data transfer includes a priority queue comprising a plurality of data chunks in an order based on utilization priority. A processor is configured to determine a reducibility score for the plurality of data chunks. A data reduction module is configured to perform a data reduction operation on a data chunk having a highest reducibility in the priority queue using a processor if sufficient resources are available. A transfer queue is configured to copy the data chunk having the lowest reducibility score from the priority queue for transmission if the transfer queue is not full.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Embodiments of the present invention handle data reduction in data transfers by prioritizing the data based on an assessment of its reducibility. Data that is not reducible, or only minimally reducible, is sent over the wire as-is, and while such data is in the pipeline, time is available to apply stronger data reduction on portions of the data that have better reduction potential. This optimizes the tradeoff between reduction ratio and expenditure of computing resources by focusing those resources on the data where reduction will be most useful. In particular, increasing the reduction ratio means that less data needs to be transferred, but higher computing resources are generally needed to perform the reduction. The present embodiments apply equally to compression and to de-duplication.

Figure 1:
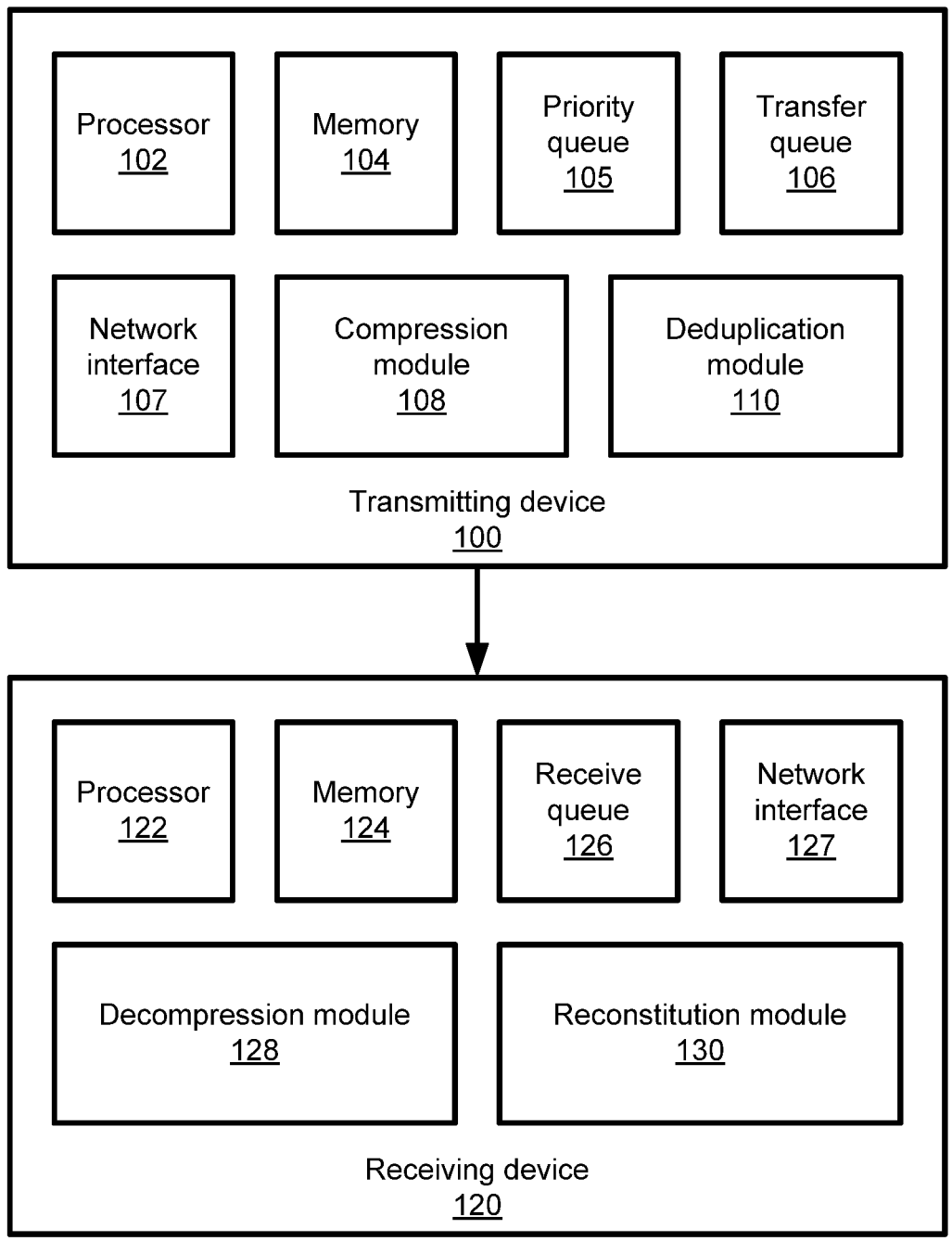
FIG. 1 is a block diagram of a system for reducing data to be transferred in accordance with the present principles.

Referring now to the drawings in which like numerals represent the same or similar elements and initially to FIG. 1, a system for transferring information is shown. The system includes a transmitting device 100 and a receiving device 120. It should be recognized that the devices are depicted in FIG. 1 in an abstract form, and that those having ordinary skill in the art will recognize that many different physical structures may accomplish the described functions. In particular, a more detailed view of one embodiment of the structures of the transmitting device 100 and the receiving device 120 is shown below in FIG. 5. The transmitting device has a hardware processor 102 and memory 104. In addition, a network interface 107 transmits information stored in a transfer queue 106 in memory 104 over a network. That network may be any appropriate medium, including wired and wireless media, that operatively connects to receiving device 120.

The transmitting device 100 includes one or more functional modules that may, in one embodiment, be implemented as software that is stored in memory 104 and executed on processor 102. In an alternative embodiment, the modules may be implemented as one or more discrete hardware units in the form of, e.g., an application specific integrated chip or field programmable gate array. In particular, a compression module 108 operates to compress chunks of data in the transfer queue 106, while a de-duplication module 110 operates to remove from the transfer queue 106 portions of the data that are already present at the receiving device 120.

The receiving device 120, meanwhile, receives data chunks from the transmitting device into a receiving queue 126. The receiving device includes a hardware processor 122 and memory, as well as a network interface 127 that receives the information from the transmitting device 100 over the network, storing the received data into the receiving queue 126 in memory 124. The transmitting device 120 further includes one or more functional modules that may, in one embodiment, be implemented as software that is stored in memory 124 and executed on processor 122. In an alternative embodiment, the modules may be implemented as one or more discrete hardware units in the form of, e.g., an application specific integrated chip or field programmable gate array. In particular, a decompression module 128 operates to decompress chunks of data in the receive queue 126, while a reconstitution module 110 operates to add portions of data from the receive queue 126 to corresponding portions of the data that were de-duplicated at the transmitting device 100 due to already being present at the receiving device 120.

The transmitting device 100 splits data from the memory 104 into chunks (e.g., portions of data 1 MB in size). The chunks may be of a single, uniform size or may, in an alternative embodiment, be different sizes. It should be recognized that, even if all data chunks begin at a uniform size, data reduction operations may cause the size of an individual data chunk to decrease. All of the chunks are entered into a priority queue 105 in addition to being added to the transfer queue 106. In one embodiment there is initially no information regarding data utilization access patterns, and so all data may be entered into the priority queue 105 with a same initial priority value at first. In an alternative embodiment, the data chunks may be assigned initial priorities based on historical utilization statistics, as discussed below.

At each time frame, as long as the priority queue 105 is not empty, if the transfer queue 106 has room then a chunk with minimal reduction potential is moved from the priority queue 105 to the transfer queue 106. Otherwise, a non-evaluated chunk is popped out of the priority queue 105 and its compressibility is estimated. Once compressibility is determined, the chunk is returned to the priority queue 105 with an updated priority and compressibility grade.

If there are free resources to run compression, the chunk in the priority queue 105 with the highest compressibility grade that can be achieved under current resource utilization is extracted, compressed by the compression module 108, and returned to the priority queue 105—this time with a lower compressibility grade in view of having already been compressed. Alternatively, or in addition, de-duplication module 110 may operate on the chunk in the priority queue to eliminate unneeded hash calculations and hash lookups.

In particular, the de-duplication module evaluates data de-duplication potential at a higher granularity before investing in the de-duplication process—de-duplication with fine granularity incurs a high overhead and is therefore deferred until a rough estimate of de-duplication potential is determined. Smaller block sizes increase processor and metadata overhead, so automatic tuning of de-duplication based on available compression and available bandwidth provides a significant improvement over static block sizes. If resources are available, de-duplication module 110 may use smaller block sizes that give a better chance of finding overlap with data already present on the receiving device 120.

De-duplication potential may be estimated by, for example, selecting a small random sample of sub-chunk blocks (e.g., 10 chunks of 4 KB each) and calculating hashes on the sample to determine if they are present in a hash table at the receiving device 120. Based on how many of the blocks are present at the receiving device 120, a de-duplication potential grade is assigned, with a high number of hash matches corresponding to a high de-duplication potential.

It should be recognized that the transmission device 100 and reception device 120 may be discrete hardware units, connected via a network. The transfer of data between two devices is a basic function of modern computers, and thus optimizing such transfer represents an improvement in the operation of the computers themselves. In addition, the present embodiments provide significant improvements in other fields, such as data backup/storage and migration. These industries regularly perform massive data transfers, and any improvement in how those data transfers are performed translates to a substantial advantage in costs, time, and resource usage.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 2:
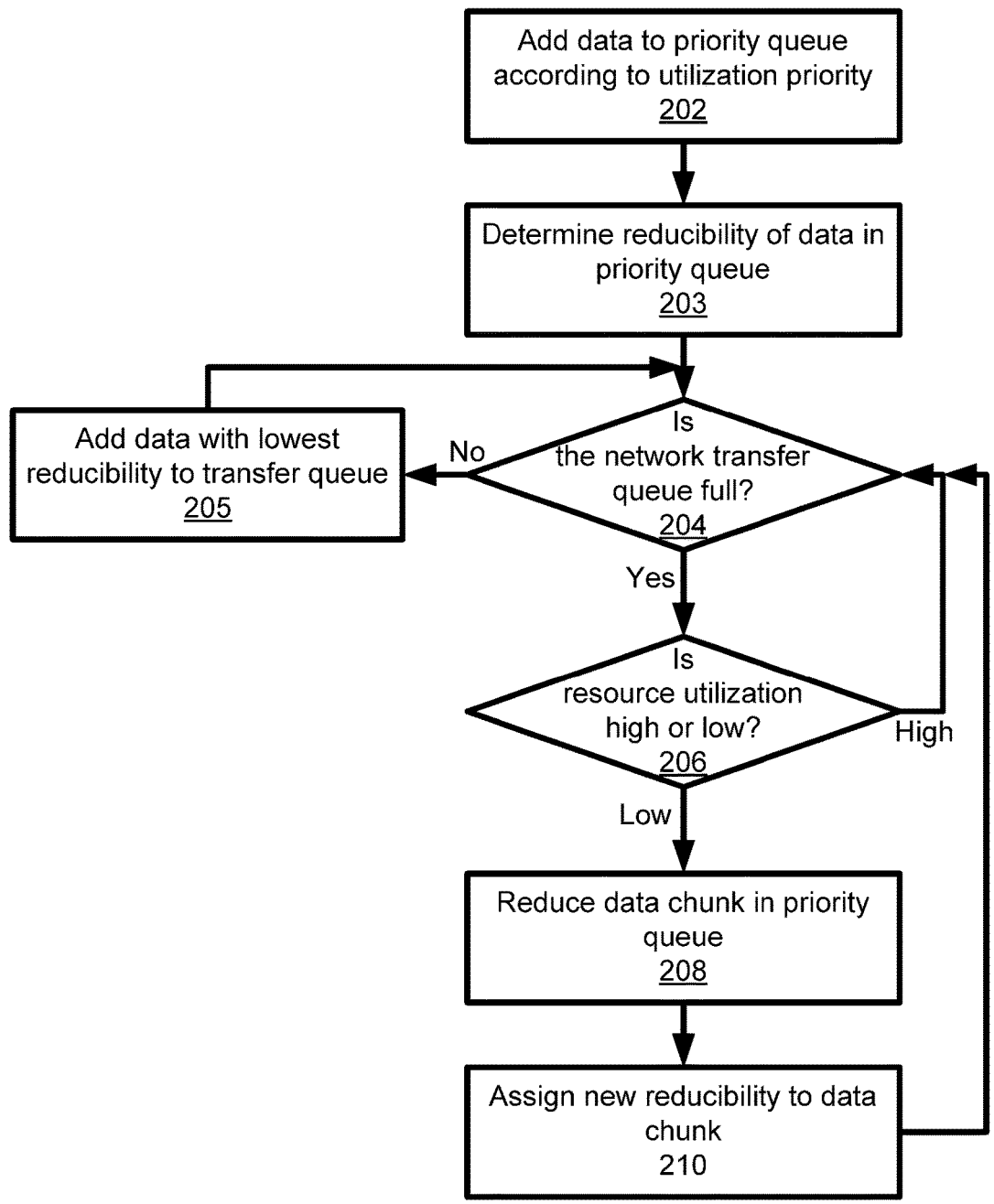
FIG. 2 is a block/flow diagram of a method of data reduction and transfer in accordance with the present principles.

Referring now to FIG. 2, a data transmission method is shown. Block 202 adds data to a priority queue 105 in chunks ordered by data chunk utilization priority, if available. Data may be chunked according to any appropriate scheme, for example by dividing the data into blocks of fixed size (e.g., 1 MB). Alternatively, data chunk size may be tuned based on the size of the network transfer queue 106 and the time needed to compute reducibility potential. Block 203 determines the reducibility of the data chunks in the priority queue 105. Reducibility may be considered in the form of compression, de-duplication, or a combination of the two, with a resulting reducibility score being associated with each data chunk in the priority queue 105. One example of determining a reducibility score based on de-duplication is shown below. Another example includes determining a compressibility of a data block using any appropriate tool. As an alternative to being performed immediately upon entering data chunks into the priority queue 105, block 203 may determine reducibility during transmission, in particular if the transfer queue is full. Blocks 202 and 203 may therefore be performed concurrently with transmission and de-duplication.

Block 204 determines whether the transfer queue 106 is full. If not, a data chunk having the lowest reducibility is moved from the priority queue 105 to the transfer queue 106 for transmission. In this manner, relatively irreducible data chunks are transmitted first. Because irreducible chunks won't benefit from data reduction, there is no advantage in keeping them in the priority queue and they are therefore transmitted first. Processing then returns to block 204. Data continues to be added to the network transfer queue 106 until the network transfer queue 106 is full. The transmitting device 100 continually transmits any information stored in the transfer queue 106.

At that time, block 206 determines whether the transmitting device 100 has a high or low resource utilization. This may include resources from processor 102 and memory 104 that are available to perform data reduction. If there are available resources (i.e., if utilization is low), block 208 selects the data chunk from the priority queue 105 that has the highest reducibility score and performs a data reduction operation on that data chunk. As noted above, data reduction may include compression, de-duplication, or both, as appropriate. If de-duplication is performed, block 208 additionally computes metadata that is attached to the data chunk and may be used to reconstitute the data at the receiving device 120. If compression is performed, any appropriate form of compression may be used, with a tradeoff existing between time and resources needed to compress a data block and time needed to transmit that data block. Block 210 then assigns a new reducibility score to the data chunk in the priority queue 105 and processing returns to block 204. In this manner, as long as there are free resources, the data in the priority queue 105 is reduced while the transfer queue 106 is full of data for transmission.

Utilization priority is determined based on utilization statistics, which represent the estimated utilization of individual chunks based on utilization history information from other nodes. These statistics may be computed, for example, by anticipating future read accesses based on demand for those data chunks on other nodes. If a large number of other nodes are using a particular chunk, identified by their hashes, within a certain time period, the utilization priority for that chunk is high. This is the case when, for example, a large number of virtual machines sharing the same data are being booted simultaneously on multiple nodes. When chunks are sent to the receiving device 120, chunks that are accessed earlier on multiple nodes may be assigned a higher utilization priority. If there is a pending request to transfer data to a receiving device 120, chunks with higher utilization priorities may be transmitted sooner than other chunks due to the prediction that they will be used earlier.

Chunks with a high utilization priority are initially placed at the top of the priority queue 105 in block 202. If utilization statistics are not known, then chunks start in the priority queue with a utilization priority of, e.g., zero or any other appropriate default number.

Figure 3:
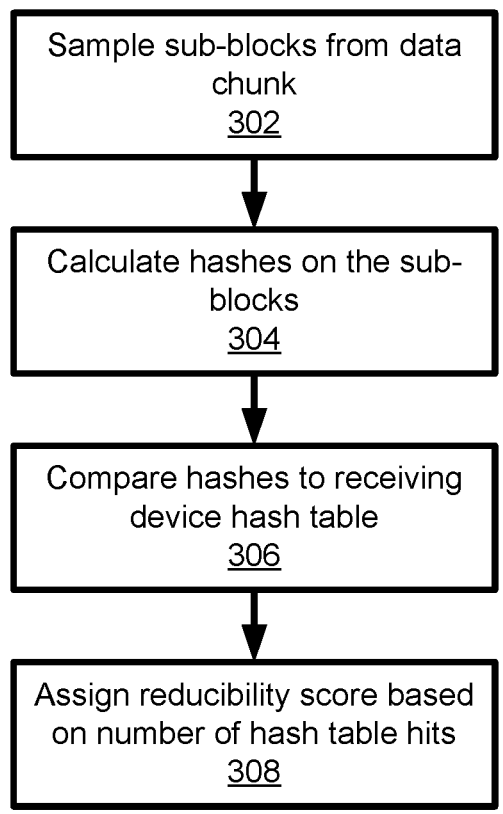
FIG. 3 is a block/flow diagram of a method of data reduction is accordance with the present principles.

Referring now to FIG. 3, a method of determining a reducibility score based on de-duplication is shown. Block 302 samples sub-blocks from a data chunk in the priority queue 105. For example, in a data chunk 1 MB in size, between about 2 and about 5 percent of the chunk may be sampled in, e.g., 4 KB chunks. In another embodiment, block 302 may adaptively set the sub-block size based on available resources. For example, if there are ample resources available, the sub-block size may be decreased. Decreasing the sub-block size leads to needing to perform more calculations for the same amount of data, but has a higher chance of finding overlap at the receiving device 120. Block 302 may furthermore progressively reduce the sub-block size if resources are available, with large sub-block sizes being used initially for fast processing and smaller sub-block sizes being used in subsequent passes if resources are available.

Block 304 calculates hashes on the sampled sub-blocks using any appropriate hashing method, for example using MD5 or SHA. Block 306 then compares these hashes to a hash table that represents data already present at the receiving device 120, storing hashes for potential data chunks at one or more sizes. It should be understood that, if the transmitting device 100 will use varying sizes for data chunks and for sub-blocks, then the hash table will need to record hashes for every possible size. In an alternative embodiment, the hash table may be stored locally at the transmitting device 100, but this may cause significant network congestion if there are multiple transmitting devices 100, as the hash tables would need to be synchronized every time there was a change. Block 308 assigns a reducibility score based on the number of hash table hits. For example, if a low percentage of the sub-blocks have matching data at the receiving device 120, then the assigned reducibility score would be low, whereas a high percentage of matching sub-blocks would have a high reducibility score. While this does not represent an ideal de-duplication potential, the estimate rapidly ascertains whether a data chunk is highly reducible.

When block 208 performs both compression and de-duplication, there may be interplay between the two forms of data reduction. De-duplication is performed before compression. When a data chunk is de-duplicated, large portions (if not all) of the data chunk will be replaced by a hash or metadata. In this case the reducibility score has two components—a compression potential and a de-duplication potential. The compression score of a chunk with a high de-duplication potential may be kept low, even if the chunk would otherwise be very compressible, because de-duplication has the potential to reduce the transmission size below the compressed size with fewer resources. Compression performed after de-duplication may still be beneficial, particularly if the de-duplication metadata is relatively small and has little effect on the overall compressibility of the data. There is a trade-off between compression and de-duplication, where compression estimation and the compression itself is intensive on local processing resources, whereas de-duplication uses additional network traffic and incurs round-trip time to send sample hashes to the receiving device 120 and to wait for an answer. As a result, de-duplication is favored for chunks with a low compressibility, as highly compressible data will realize a significant portion of its reduction potential through compression.

Figure 4:
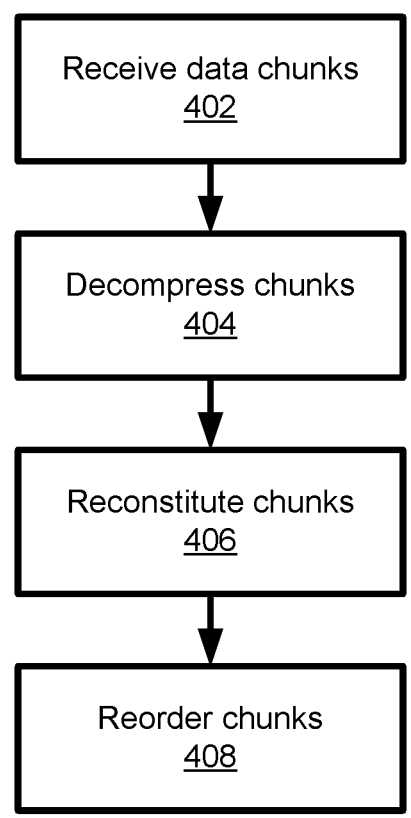
FIG. 4 is a block/flow diagram of a method of data reception and expansion in accordance with the present principles.

Referring now to FIG. 4, a method of receiving data is shown. Block 402 receives the data chunks from the transmitting device 102 and places the data chunks into receive queue 126. Block 404 decompresses any chunks in the receive queue 126 that were compressed before transmission. Block 406 reconstitutes any chunks that were de-duplicated before transmission. In the case of a de-duplicated block, portions of the block have been replaced with a hash or with other metadata identifying the corresponding data at the receiving device 120. Block 406 therefore recalls the identified data and combines it with any other data transmitted in the chunk to reconstitute the original chunk. Based on the prioritization in the transmitting device 100, it is likely that data chunks will arrive out of order. Block 408 reorders the chunks to reproduce the original data set.

Figure 5:
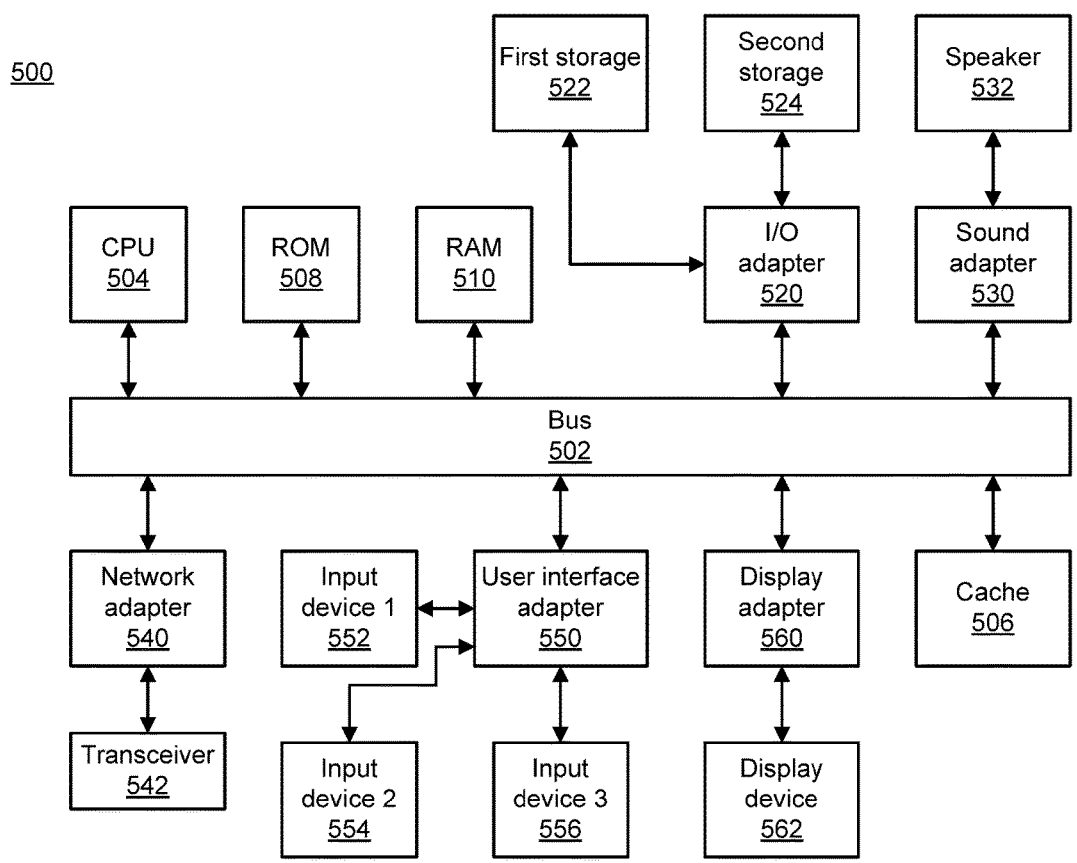
FIG. 5 is a block diagram of a processing system in accordance with the present principles.

Referring now to FIG. 5, an exemplary processing system 500 is shown which may represent the transmitting device 100 or the receiving device 120. The processing system 500 includes at least one processor (CPU) 504 operatively coupled to other components via a system bus 502. A cache 506, a Read Only Memory (ROM) 508, a Random Access Memory (RAM) 510, an input/output (I/O) adapter 520, a sound adapter 530, a network adapter 540, a user interface adapter 550, and a display adapter 560, are operatively coupled to the system bus 502.

A first storage device 522 and a second storage device 524 are operatively coupled to system bus 502 by the I/O adapter 520. The storage devices 522 and 524 can be any of a disk storage device (e.g., a magnetic or optical disk storage device), a solid state magnetic device, and so forth. The storage devices 522 and 524 can be the same type of storage device or different types of storage devices.

A speaker 532 is operatively coupled to system bus 502 by the sound adapter 530. A transceiver 542 is operatively coupled to system bus 502 by network adapter 540. A display device 562 is operatively coupled to system bus 502 by display adapter 560.

A first user input device 552, a second user input device 554, and a third user input device 556 are operatively coupled to system bus 502 by user interface adapter 550. The user input devices 552, 554, and 556 can be any of a keyboard, a mouse, a keypad, an image capture device, a motion sensing device, a microphone, a device incorporating the functionality of at least two of the preceding devices, and so forth. Of course, other types of input devices can also be used, while maintaining the spirit of the present principles. The user input devices 552, 554, and 556 can be the same type of user input device or different types of user input devices. The user input devices 552, 554, and 556 are used to input and output information to and from system 500.

Of course, the processing system 500 may also include other elements (not shown), as readily contemplated by one of skill in the art, as well as omit certain elements. For example, various other input devices and/or output devices can be included in processing system 500, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized as readily appreciated by one of ordinary skill in the art. These and other variations of the processing system 500 are readily contemplated by one of ordinary skill in the art given the teachings of the present principles provided herein.

Having described preferred embodiments of network utilization improvement by data reduction based migration prioritization (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for data transfer, comprising:
adding a plurality of data chunks to a priority queue in an order based on utilization priority;
determining a reducibility score for the plurality of data chunks;
performing a data reduction operation on a data chunk having a highest reducibility in the priority queue using a processor; and
moving the data chunk having the lowest reducibility score from the priority queue to a transfer queue for transmission.

2. The method of claim 1, wherein determining the reducibility score comprises determining an estimate of de-duplication potential of the plurality of data chunks.

3. The method of claim 2, wherein determining an estimate of de-duplication potential comprises sampling sub-blocks of a data chunk and comparing the sub-blocks to a hash table, wherein the reducibility score is based on a number of sub-block hash matches.

4. The method of claim 3, wherein a size of the sub-blocks is progressively reduced.

5. The method of claim 2, wherein performing the data reduction operation on a data chunk comprises de-duplicating the data chunk and creating metadata for the data chunk to guide reconstitution.

6. The method of claim 1, wherein determining the reducibility score comprises determining a compressibility of the plurality of data chunks.

7. The method of claim 6, wherein performing the data reduction operation on a data chunk comprises compressing the data chunk.

8. The method of claim 1, further comprising assigning a new reducibility score to the reduced data chunk after performing the data reduction operation.

9. The method of claim 1, wherein the utilization priority is based on historical utilization statistics.

10. A computer readable storage medium comprising a computer readable program for data transfer, wherein the computer readable program when executed on a computer causes the computer to perform the steps of:
adding a plurality of data chunks to a priority queue in an order based on utilization priority;
determining a reducibility score for the plurality of data chunks;
performing a data reduction operation on a data chunk having a highest reducibility in the priority queue using a processor; and
moving the data chunk having the lowest reducibility score from the priority queue to a transfer queue for transmission.

11. A system for data transfer, comprising:
a priority queue comprising a plurality of data chunks in an order based on utilization priority;
a processor configured to determine a reducibility score for the plurality of data chunks;
a data reduction module configured to perform a data reduction operation on a data chunk having a highest reducibility in the priority queue using a processor; and
a transfer queue configured to copy the data chunk having the lowest reducibility score from the priority queue for transmission.

12. The system of claim 11, wherein the processor is further configured to determine an estimate of de-duplication potential of the plurality of data chunks.

13. The system of claim 12, wherein the data reduction module comprises a de-duplication module configured to sample sub-blocks of a data chunk and to compare the sub-blocks to a hash table, wherein the reducibility score is based on a number of sub-block hash matches.

14. The system of claim 13, wherein a size of the sub-blocks is progressively reduced.

15. The system of claim 13, wherein the de-duplication module is further configured to de-duplicate the data chunk and to create metadata for the data chunk to guide reconstitution.

16. The system of claim 11, wherein the processor is further configured to determine a compressibility of the plurality of data chunks.

17. The system of claim 16, wherein the data reduction module comprises a compression module configured to compress the data chunk.

18. The system of claim 11, wherein the processor is further configured to assign a new reducibility score to the reduced data chunk after the data reduction operation has been performed.

19. The system of claim 11, wherein the utilization priority is based on historical utilization statistics.

\* \* \* \* \*